(12) United States Patent
Sun

(10) Patent No.: US 9,633,701 B2
(45) Date of Patent: Apr. 25, 2017

(54) RESISTOR SWITCHING CIRCUIT, STORAGE CIRCUIT, AND CONSUMABLE CHIP

(71) Applicant: APEX MICROELECTRONICS CO., LTD., Guangdong (CN)

(72) Inventor: Wanli Sun, Guangdong (CN)

(73) Assignee: APEX MICROELECTRONICS CO., LTD., Guangdong (CN)

( * ) Notice: Subject to any disclaimer, the term of this patent is extended or adjusted under 35 U.S.C. 154(b) by 0 days.

(21) Appl. No.: 15/122,722

(22) PCT Filed: Nov. 25, 2015

(86) PCT No.: PCT/CN2015/095536
§ 371 (c)(1),
(2) Date: Aug. 31, 2016

(87) PCT Pub. No.: WO2016/082760
PCT Pub. Date: Jun. 2, 2016

(65) Prior Publication Data
US 2017/0069357 A1    Mar. 9, 2017

(30) Foreign Application Priority Data

Nov. 28, 2014 (CN) .......................... 2014 1 0715520
Jun. 10, 2015 (CN) .......................... 2015 1 0317377

(51) Int. Cl.
*G11C 7/00* (2006.01)
*G11C 13/00* (2006.01)

(52) U.S. Cl.
CPC ............ *G11C 7/00* (2013.01); *G11C 13/0002* (2013.01); *G11C 13/0004* (2013.01); *G11C 13/0023* (2013.01); *G11C 13/0069* (2013.01)

(58) Field of Classification Search
CPC ... G11C 7/00; G11C 13/0002; G11C 13/0004; G11C 13/0021; G11C 13/0023; G11C 13/004; G11C 13/0069
(Continued)

(56) References Cited

U.S. PATENT DOCUMENTS

| 2007/0126498 A1 | 6/2007 | Kresse et al. |
| 2012/0044733 A1* | 2/2012 | Scheuerlein ........... B82Y 10/00 365/51 |
| 2012/0257437 A1* | 10/2012 | Seko ................... G11C 11/5678 365/148 |

FOREIGN PATENT DOCUMENTS

| CN | 1932914 A | 3/2007 |
| CN | 202332456 U | 7/2012 |

(Continued)

OTHER PUBLICATIONS

International Search Report issued in PCT/CN2015/095536 mailed Feb. 2, 2016 (5 pages).
(Continued)

*Primary Examiner* — Tan T. Nguyen
(74) *Attorney, Agent, or Firm* — RatnerPrestia

(57) ABSTRACT

A resistor switching circuit, a storage circuit and a consumable chip. The resistor switching circuit is used in the consumable chip, and includes a plurality of resistor switching branch circuits, the resistor switching branch circuit including a switching switch and a resistor, the switching switch and the resistor being connected in series in a conducting loop of a signal wire; and a decoder, connected to a data storage module in the consumable chip, and used for generating a switching instruction according to a signal output by the data storage module to control a switching switch of a corresponding resistor switching branch circuit to put a corresponding resistor into the conducting loop of
(Continued)

the signal wire, so as to change a resistance value of the conducting loop of the signal wire.

20 Claims, 2 Drawing Sheets

(58) Field of Classification Search
USPC .............................. 365/191, 148, 158, 163
See application file for complete search history.

(56) References Cited

FOREIGN PATENT DOCUMENTS

| CN | 203191538 U | 9/2013 |
|----|-------------|--------|
| CN | 104952485 A | 9/2015 |
| JP | H 08-235875 A | 9/1996 |

OTHER PUBLICATIONS

PCT Written Opinion of the International Search Authority issued in PCT/CN2015/095536 mailed Feb. 2, 2016 (8 pages).

\* cited by examiner

RESISTOR SWITCHING CIRCUIT, STORAGE CIRCUIT, AND CONSUMABLE CHIP

CROSS-REFERENCE TO RELATED APPLICATION

The present application is the national phase of International Application No. PCT/CN2015/095536, titled "RESISTOR SWITCHING CIRCUIT, STORAGE CIRCUIT, AND CONSUMABLE CHIP", filed on Nov. 25, 2015, which claims the priority to Chinese Patent Application No. CN201410715520.0, entitled "SIGNAL SOURCE IDENTIFICATION CIRCUIT AND CONSUMABLE CHIP INCLUDING THE SAME" and filed on Nov. 28, 2014 with the State Intellectual Property Office of People's Republic of China, and the priority to Chinese Patent Application No. CN2015103173774, entitled "RESISTOR SWITCHING CIRCUIT, STORAGE CIRCUIT, AND CONSUMABLE CHIP" and filed on Jun. 10, 2015 with the State Intellectual Property Office of People's Republic of China, all of which are incorporated herein by reference in their entireties.

FIELD

The present disclosure relates to the field of printing and imaging technology, and particularly to a resistor switching circuit, a storage circuit and a consumable chip.

BACKGROUND

A printing and imaging device has been diversified. The printing and imaging device widely used at present includes an ink jet printer, a laser printer, an LED printer, a needle printer, a thermal printer and so on. In a process of printing, the printing and imaging device will consume a coloring material such as ink or toner, and the coloring material is normally placed in a consumable cartridge to be supplemented or replaced conveniently.

A consumable chip is provided on the consumable cartridge, in order to electronically record information such as a source and usage of the consumable cartridge. In this way, in a case that the coloring material in the consumable cartridge is used up, the coloring material can be supplemented by a user by replacing the consumable cartridge. The printing and imaging device reads the information on the consumable chip electronically, so as to update a state of the printing and imaging device timely and automatically without manually entering, by a user, information of the consumable cartridge such as a type and a production date.

In an existing consumable chip, an EPPOM is normally adopted as a memory unit. The printing and imaging device can access or rewrite data in the EPPOM by selectively inputting a voltage source signal or a current source signal to a signal line ID. Since erasure for the EPROM can only be realized by illuminating the EPROM for 20 minutes with ultraviolet light or X-ray, and such an erasure tool is not provided in a printer generally, the printer can only change the data in the consumable chip from "0" to "1", or in other words, data in each bit of the consumable chip can only be rewritten once. However, in a production process of the consumable chip, once the consumable chip is programmed, it is difficult to modify the consumable chip, e.g., modify a model and a production date of the consumable cartridge. In addition, an erasure process of the EPROM for recycling the consumable chip is time consuming, which results in low recycle efficiency and therefore increased cost.

If a non-volatile memory (for example, a flash memory) easy to be rewritten is adopted as the memory unit in the consumable chip, whether "0" or "1" is read out is represented by the non-volatile memory by outputting a high level or a low level in response to access of the printing and imaging device. The data on the high level or the low level cannot be directly transmitted to the printing and imaging device via the signal line.

SUMMARY

In order to solve the problems described above, the present disclosure provides a resistor switching circuit applied in a consumable chip. The resistor switching circuit includes:

multiple resistance switching branches, where each of the multiple resistance switching branches includes a switching switch and a resistor which are connected in series in a conductive loop of a signal line; and a decoder connected with a data storage module in the consumable chip and configured to generate a switching instruction based on a signal outputted by the data storage module, to control the switching switch of a respective one of the resistance switching branches to connect the resistor corresponding to the switching switch to the conductive loop of the signal line, so as to change a resistance value in the conductive loop of the signal line.

According to an embodiment of the present disclosure, the resistor switching circuit may include four resistance switching branches, with resistance values of resistors in the four resistance switching branches being different from each other and increasing gradually from a first resistance switching branch to a fourth resistance switching branch.

According to an embodiment of the present disclosure, the decoder may be a 2/4 decoder.

According to an embodiment of the present disclosure, the decoder may be configured to:

generate a switching instruction to connect the resistor in the first resistance switching branch to the conductive loop of the signal line, in a case that data received by the decoder is "00";

generate a switching instruction to connect the resistor in a second resistance switching branch to the conductive loop of the signal line, in a case that data received by the decoder is "01";

generate a switching instruction to connect the resistor in a third resistance switching branch to the conductive loop of the signal line, in a case that data received by the decoder is "10"; or generate a switching instruction to connect the resistor in the fourth resistance switching branch to the conductive loop of the signal line, in a case that data received by the decoder is "11".

According to an embodiment of the present disclosure, the switching switch may include a transistor.

The present disclosure further provides a storage circuit applied in a consumable chip. The storage circuit includes:

a data storage module;

a read/write control circuit connected with the data storage module and configured to, based on an operation instruction and address data, write data into the data storage module or control the data storage module to output data; and a resistor switching circuit according to any one of the embodiments described above, where the resistor switching circuit may be configured to change a resistance value in a conductive loop of a signal line based on the data outputted by the data storage module.

According to an embodiment of the present disclosure, the storage circuit may include multiple resistor switching circuits.

According to an embodiment of the present disclosure, the data storage module may include any one of an EERPOM memory, a ferroelectric memory, a phase change memory, a flash memory, and a volatile memory connected with a power supply.

The present disclosure further provides a consumable chip including the storage circuit according to any one of the embodiments described above.

According to an embodiment of the present disclosure, the consumable chip may further include an operation instruction generation circuit connected with the signal line and configured to generate an operation instruction based on a signal transmitted via the signal line and output the operation instruction to the read/write control circuit.

The resistor switching circuit according to the present disclosure is particularly suitable for the non-volatile memory easy to be rewritten. Such non-volatile memory easy to be rewritten represents whether "0" or "1" is read out by outputting a high level or a low level in response to a read instruction, and the level is unable to match with the printing and imaging device normally. The resistor switching circuit according to the present disclosure changes a resistance in the conductive loop of the signal line based on a level signal outputted by the memory, so as to change a voltage of the signal line. In this way, the printing and imaging device can acquire data at a corresponding address of the memory by detecting the voltage on the signal line. The consumable chip including the resistor switching circuit can be modified easily and is suitable for the printing and imaging device which accesses the data of the consumable chip through a voltage source or a current source, thereby facilitating maintenance of the consumable chip and improving the recycle efficiency.

Other features and advantages of the present disclosure will be described in the subsequent specification, and partially become apparent from the specification, or be understood by embodying the present disclosure. The objective and other advantages of the present disclosure can be realized and acquired through a structure set forth particularly in the specification, claims and drawings.

BRIEF DESCRIPTION OF THE DRAWINGS

In order to clearly illustrate the technical solution in the embodiments of the present disclosure or in the conventional technology, the drawings required for description of the embodiments or the conventional technology are introduced simply below.

DETAILED DESCRIPTION OF THE EMBODIMENTS

The embodiments of the present disclosure are described in detail below in conjunction with the drawings and the embodiments, so as to fully understand and implement the implementation process of how the present disclosure solves the technical problem via technical means and achieves the technical effect. It is to be understood that the embodiments of the present disclosure and features of the embodiments of the present disclosure can be combined with each other as long as no conflict occurs, and a technical solution formed in this way falls within the scope of protection of the present disclosure.

Also, multiple specific details are set forth in the specification for purposes of explanation, to provide throughout understanding of the embodiments of the present disclosure. However, it is apparent to those skilled in the art that the present disclosure can be implemented without the specific details here or the described specific ways.

Figure 1:
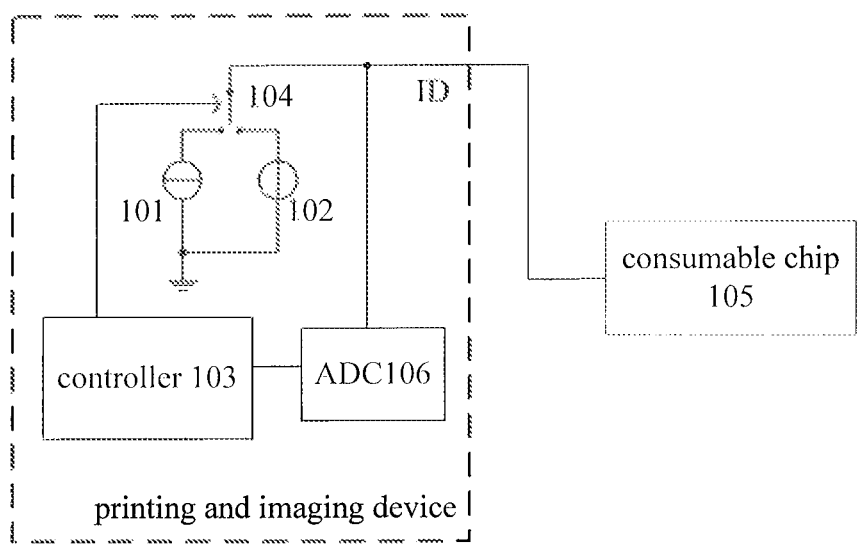
FIG. 1 is a schematic diagram of a connection relation between an existing printing and imaging device and a consumable chip.

Some of the existing printing and imaging devices are configured to read information on a consumable chip or write information into the consumable chip by means of a connection way shown in FIG. 1. As shown in FIG. 1, a current source 101 and a voltage source 102 are provided in the printing and imaging device. Normally, the voltage source 102 has an output voltage of 16V and a drive current greater than 10 mA; and the current source 101 has a drive current of 1 mA and a highest voltage amplitude of 15V. Under control of a controller 103, a switching switch 104 can switch to output a current source signal or a voltage source signal onto a signal line ID.

The signal line ID is connected to a consumable chip 105. In a case that the printing and imaging device performs a read operation, the printing and imaging device outputs the current source signal onto the signal line ID, and detects a voltage on the signal line ID via an ADC 106, so as to read out data stored in the consumable chip. In a case that the printing and imaging device performs a write operation, the printing and imaging device outputs the voltage source signal onto the signal line ID, so as to write data to be written into the consumable chip.

To solve the problem that the existing consumable chip is unable to directly communicate with the printing and imaging device in a case that non-volatile memory (for example, the flash memory) easy to be rewritten is adopted as the memory unit, the present disclosure provides a new resistor switching circuit and a storage circuit and a consumable chip which include the resistor switching circuit.

Figure 2:
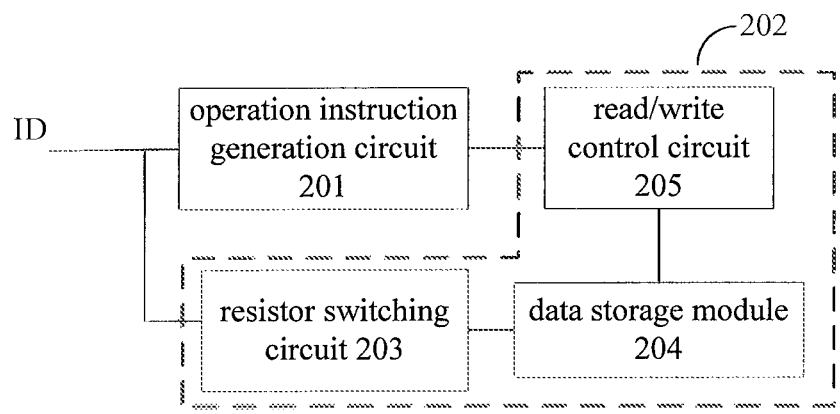
FIG. 2 is a schematic structural diagram of a consumable chip according to an embodiment of the present disclosure.

FIG. 2 is a schematic structural diagram of a consumable chip according to the embodiment. As shown in FIG. 2, the consumable chip according to the embodiment includes an operation instruction generation circuit 201 and a storage circuit 202. Specifically, the operation instruction generation circuit 201 is configured to identify whether a voltage source signal or a current source signal is transmitted on a signal line ID, that is, whether a voltage source or a current source is connected with the signal line ID in the printing and imaging device. In a case that the voltage source signal is transmitted on the signal line ID, the operation instruction generation circuit 201 outputs a write instruction WR; or in a case that the current source signal is transmitted on the signal line ID, the operation instruction generation circuit 201 outputs a read instruction RD.

In the embodiment, the operation instruction generation circuit 201 includes one input terminal for receiving a signal transmitted on the signal line ID and two output terminals. The two output terminals include a read instruction output terminal RD and a write instruction output terminal WR. Therefore, the operation instruction generation circuit in the embodiment is also referred to as a RD/WR identification circuit.

In the consumable chip according to the embodiment, the storage circuit 202 includes a resistor switching circuit 203, a data storage module 204 and a read/write control circuit 205. The read/write control circuit 205 is connected with the data storage module 204 and the operation instruction generation circuit 201, and is configured to perform a read/write operation on a corresponding address of the data storage module 204 based on address data that is received and an operation instruction that is generated by the operation instruction generation circuit 201.

Specifically, in a case that the operation instruction generation circuit 201 generates a write instruction, the read/write control circuit 205 writes data into corresponding address space of the data storage module 204; and in a case that the operation instruction generation circuit 201 generates a read instruction, the read/write control circuit 205 controls the data storage module 204 to output data stored in corresponding address space to the resistor switching circuit 203.

In different embodiments of the present disclosure, in the data storage module 204, a memory (for example, an EEPROM, a ferroelectric memory, a phase change memory, a flash memory and the like) easy to be programmed and erased may be adopted as the memory unit, or a combination (for example, an SRAM having a battery and the like) of an volatile memory and a power supply may be adopted as the memory unit, which is not limited in the present disclosure. In the embodiment, information stored in the data storage module 204 includes consumable-cartridge identification information, a manufacturer, a production date, ink usage amount, ink remaining amount, a toner color and so on. Of course, in other embodiments of the present disclosure, the information stored in the data storage module 204 may include some of the information described above, or may further include other reasonable information not listed, which is not limited in the present disclosure.

The read instruction output terminal RD and the write instruction output terminal WR each output a high-level signal or a low-level signal. In the embodiment, the high-level signal is defined as an effective signal. That is, in a case that the read instruction output terminal RD outputs the high-level signal, it indicates that a read instruction is effective. a case that the write instruction output terminal WR outputs the high-level signal, it indicates that a write instruction is effective.

The effective signal outputted by the operation instruction generation circuit 201 only includes two signals, that is, either the read instruction or the write instruction is effective. In other embodiments of the present disclosure, the two output terminals can be integrated into one output terminal in the operation instruction generation circuit 201. For example, in a case that a high-level signal is outputted by the output terminal, it is defined that the write instruction is effective; and in a case that a low-level signal is outputted by the output terminal, it is defined that the read instruction is effective. In this way, the storage circuit 202 only has one input port to receive the read/write instruction, and does not require two ports to respectively receive the read instruction and the write instruction, thereby not only simplifying a circuit structure of the data storage circuit, but also simplifying an analysis processing process of the read/write instruction by the data storage circuit, and therefore improving read/write efficiency for data.

In a case that the operation instruction generation circuit 201 outputs a high-level signal at the read instruction output terminal RD, it indicates that the printing and imaging device is to read out data stored in the consumable chip. The printing and imaging device reads out the data by detecting a voltage on the signal line ID. In this case, the storage circuit 202 of the consumable chip outputs data at a target address of the storage circuit 202 to the resistor switching circuit 203 based on received address information.

In response to the read instruction, the resistor switching circuit 203 selects a resistance value by means of a switch based on the data outputted by the data storage circuit. The resistor switching circuit 203 also receives a current source signal outputted by the signal line ID. Since the current source signal flows through the selected resistance value in the resistor switching circuit 203, voltage drop is generated. The digital-to-analog converter ADC in the printing and imaging device can detect a voltage on the signal line ID, thereby reading the data.

Different resistance values can be obtained by reasonably combining resistance values in the resistor switching circuit. For example, in the embodiment, the combined resistance values in the resistor switching circuit include 1.5 kΩ, 4 kΩ, 7 kΩ and an infinite value, which are four resistance values between a source electrode and a drain electrode in an EPROM circuit in the conventional technology.

As mentioned above, the consumable chip in the embodiment determines an intention of the printing and imaging device based on the signal outputted by the printing and imaging device on the signal line ID. In a case that a current source signal is transmitted on the signal line ID, the consumable chip determines that the printing and imaging device is to perform a read operation; and in a case that a voltage source signal is transmitted on the signal line ID, the consumable chip determines that the printing and imaging device is to perform a write operation (for example, a programming operation).

The non-volatile memory (for example, the flash memory) easy to be rewritten is not directly suitable for the printing and imaging device which accesses data of the consumable chip through the voltage source and the current source. The operation instruction generation circuit in the embodiment may generate a corresponding operation instruction (for example, the read instruction and the write instruction) based on the voltage source signal or the current source signal, so that the non-volatile memory easy to be rewritten can be installed and used in the printing and imaging device.

In a case that the operation instruction generation circuit identifies that the ID signal is the current source signal, that is, an effective signal inputted to the storage circuit is the read signal, the consumable chip feedbacks information at a target address to the printing and imaging device based on the read signal and the address information that is received from the printing and the imaging device.

Figure 3:
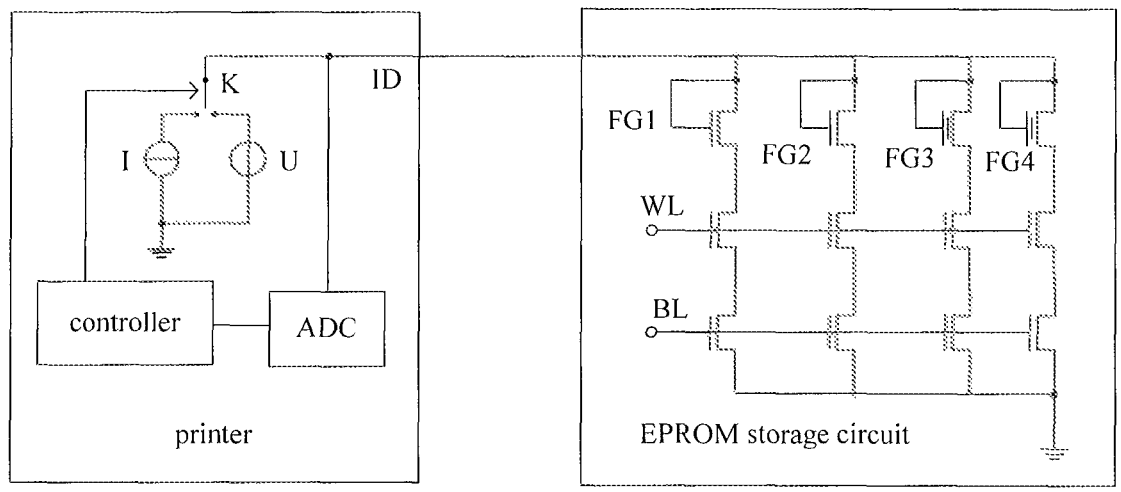
FIG. 3 is a schematic structural diagram of a storage circuit in an existing consumable chip.

The existing printing and imaging device reads information on the consumable chip by a connection way shown in FIG. 3. A current source I and a voltage source U are provided in the printing and imaging device. Specifically, the voltage source U has an output voltage of 16V, and a drive current greater than 10 mv; and current source I has a drive current of 1 mA, and a highest voltage amplitude of 15V. Under control of a controller, a switch K may be used to switch to output a current source signal or a voltage source signal onto the signal line ID.

The signal line ID is connected with an EPROM (Electrically Programmable Read-Only-Memory) storage circuit of the consumable chip. The EPROM storage circuit illustratively includes four information bits, that is, FGI, FG2, FG3 and FG4. Specifically, the bit FG1 is a reference bit, and is set to be un-programmable. The bit FG2 has been programmed completely, and a resistance value between a drain electrode and a source electrode is very large (equivalent to an open circuit). Each of the bits FG3 and FG4 is a stacked-gate injection MOS (Stacked-gate Injection Metal Oxide Semiconductor).

The consumable chip receives address information sent by a printer (a transmission path for the address information is not shown in FIG. 3), and selects a bit to be accessed through a word line WL (Word Line) and a bit line BL (Bit Line) after decoding. A source electrode of the selected bit is connected with a low level.

For example, in a case that the printer is to program the bit FG4 (normally it is defined that the programming is to write "1", and information "1" is stored in the programmed SIMOS), the printer outputs a voltage source signal on the signal line ID, and selects the bit FG4 through the word line WL and the bit line BL.

Since a control gate electrode and a drain electrode of the bit FG4 have a high voltage of 16V, and a source electrode thereof has a low level, a programming condition for the SIMOS is met, and avalanche breakdown occurs in a PN junction between the drain electrode of FG4 and a substrate. High-energy electrons generated by the avalanche breakdown passes through a silicon oxide insulation layer of the control gate electrode under effect of a gate electric field, to inject into a floating gate. After the electrodes are injected into the floating gate, a turn-on voltage (also referred to as a threshold voltage) of the SIMOS is raised.

In order to access the EPROM storage circuit, the printer outputs a current source signal on the signal line ID, and selects a bit pointed by address information through the word line WL and the bit line BL. In this case, the digital-to-analog converter ADC (analog to digital converter) provided within the printer may detect a voltage on the signal line ID. The printer can determine a value read in the EPROM storage circuit based on the voltage value.

For example, in a case that the printer is to read data in the bit FG3, since the FG3 is not programmed (it is defined that information "0" is stored in FG3), a turn-on voltage of the bit FG3 is low, a resistance value between a drain electrode and a source electrode of FG3 is low (approximately 1.5 kΩ). In this case, a voltage detected on the signal line ID by the printer is approximately 1.5V.

Similarly, in a case that the printer is to access the bit FG4, since the bit FG4 is programmed, a turn-on voltage of the bit FG4 is raised, and a resistance value between a drain electrode and a source electrode of the FG4 is increased (approximately 7 kΩ). In this case, a voltage detected on the signal line ID by the printer is approximately 7V.

In a case that the printer is to access the reference bit FG1, a resistance value between a drain electrode and a source electrode of FG1 is a value (for example, 4 kΩ) between a value in a case of being programmed and a value in a case of being un-programmed. In this case, a voltage detected on the signal line ID by the printer is approximately 4V.

In a case that the printer is to access the bit FG2, since FG2 is equivalent to an open circuit, a voltage detected on the signal line ID by the printer is the highest voltage amplitude (i.e., 15V) outputted by the current source.

It can be seen that, in a case that the printer is to access the consumable chip, the digital-to-analog converter ADC will read four signals having different voltage values instead of only a high-level signal or a low-level signal.

In a case that the non-volatile memory (for example, the flash memory) is adopted to store data in the consumable chip, the consumable chip is unable to be directly suitable for the printing and imaging device which accesses the consumable chip through the voltage source/current source. This is because that read/write operation performed on the memory in the consumable chip is realized by adding a read indication code or a write indication code to an instruction, and the consumable chip represents whether "0" or "1" is read out by outputting a high-level signal or a low-level signal.

Figure 4:
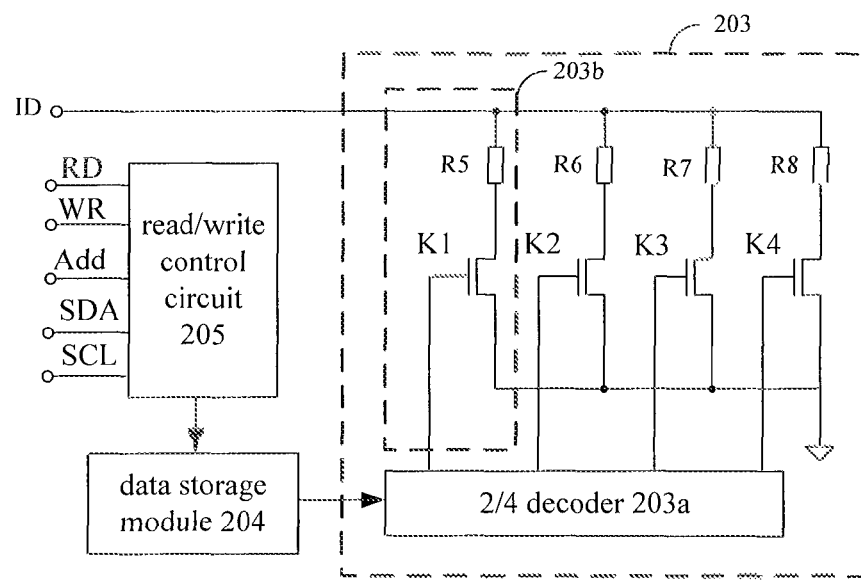
FIG. 4 is a schematic structural diagram of a storage circuit according to an embodiment of the present disclosure.

For the problem described above, a novel resistor switching circuit is provided according to the present disclosure, for reading corresponding data in the data storage module. FIG. 4 is a schematic structural diagram of a storage circuit according to an embodiment.

As shown in FIG. 4, in the embodiment, an input terminal of a read/write control circuit 205 includes a read instruction receiving port RD, a write instruction receiving port WR and an address information receiving port Add. In addition, the read/write control circuit further includes some interfaces (for example, a series data port SDA and a series clock port SCK using the IIC protocol) for purposes of production and processing, to program and erase a memory array.

The resistor switching circuit 203 includes a decoder 203a and four resistance switching branches 203b. The four resistance switching branches have a same structure. Each of the four resistance switching branches includes a switching switch and a resistor which are connected in series in a conductive loop of a signal line. Specifically, as shown in FIG. 4, in the embodiment, a first resistance switching branch includes a resistor R5 and a transistor K1. The resistor R5 is connected between the signal line ID and a source electrode of the transistor K1, a gate electrode of the transistor K1 is connected with a corresponding port of the decoder 203a, and a drain electrode of the transistor K1 is grounded. A second resistance switching branch, a third resistance switching branch and a fourth resistance switching branch each have a same structure as the structure of the first resistance switching branch, and the only difference is that the four resistance switching branches have the resistors with different resistance values. In the embodiment, the resistance values of the resistors (that is, from a resistor R1 to a resistor R4) increases gradually from the first resistance switching branch to a fourth resistance switching branch.

The decoder 203a is connected with a data storage module 204, and is configured to generate a switching instruction based on a signal outputted by the data storage module 204, to control the switching switch of a respective one of the resistance switching branches to connect the resistor corresponding to the switching switch to the conductive loop of the signal line ID (that is, to turn on the resistance switching branch), so as to change a resistance value in the conductive loop of the signal line ID.

As shown in FIG. 4, in a case that the storage circuit 202 uses two bits to represent information stored in an SIMOS of the EPROM, the resistor switching circuit 203 includes a resistor array including resistors R5, R6, R7 and R8 and transistors K1, K2, K3 and K4 connected with the resistors R5, R6, R7 and R8 respectively to serve as a switch, and a 2/4 decoder.

In the embodiment, resistance values of the four resistors are 1.5 kΩ, 4 kΩ, 7 KΩ and 10 MΩ, respectively. As described above, in a case that 00 represents "0", 01 represents a reference bit, 10 represents "1" and 11 represents a bit having a large resistance value, the 2/4 decoder 203a associates 00 outputted by the data storage module 204 with the switching switch K1, associates 01 outputted by the data storage module 204 with the switching switch K2, associates 10 outputted by the data storage module 204 with the switching switch K3 and associates 11 outputted by the data storage module 204 with the switching switch K4.

In a case that the address information indicates that SIMOS programmed is to be read, data 10, i.e., "1", is stored at an address of the data storage module 204 corresponding to the address information. In this case, the read/write control circuit 205 controls the data storage module 204 to output the data 10 stored therein to the 2/4 decoder 203a. The 2/4 decoder 203a outputs a high level at a gate electrode of the switching switch K3 to turn on the switching switch K3, to select the third resistor R7, and other switching switches are turned off in this case. Since the resistance value of the third resistor R7 is 7 kΩ. A dividing voltage of 7V is generated on the resistor R7 by the current source signal, and a voltage of the signal line ID is 7V. The voltage is detected by the ADC in the printing and imaging device, to read the data "1".

Practically, in other embodiments of the present disclosure, bit values in the memory array corresponding to data "0" and data "1" may be other reasonable values, and the number of output terminals of the decoder and the number of resistance switching branches may be adjusted, which is not limited in the present disclosure. For example, in an embodiment of the present disclosure, 000 represents "0", and 111 represents "1"; and in this case, eight resistance switching branches may be provided and a 3/8 decoder may be used.

It should be illustrated that, in other embodiments of the present disclosure, the storage circuit of the consumable chip may include multiple resistor switching circuits. Each of the multiple resistor switching circuits is connected with the data storage module 204, which is not limited in the present disclosure.

It can be seen from above that, in the existing printing and imaging device, the consumable chip is accessed through the voltage source/current source, and the EPROM storage circuit is used in the consumable chip. Since the EPROM storage circuit can be wrote only once, it is not convenient to maintain or recycle the consumable chip in such printing and imaging device.

The resistor switching circuit is provided in the embodiment, which is particularly suitable for the non-volatile memory easy to be rewritten. Such non-volatile memory easy to be rewritten represents whether "0" or "1" is read out by outputting a high level or a low level in response to a read instruction, and the level is unable to match with the printing and imaging device normally. The resistor switching circuit according to the embodiments changes a resistance value in the conductive loop of the signal line based on a level signal outputted by the memory, so as to change a voltage of the signal line. In this way, the printing and imaging device can acquire data at a corresponding address of the memory by detecting the voltage on the signal line. The consumable chip including the resistor switching circuit can be modified easily and is suitable for the printing and imaging device which accesses the data of the consumable chip through a voltage source or a current source, thereby facilitating maintenance of the consumable chip and improving the recycle efficiency.

It can be understood that the embodiments disclosed in the present disclosure are not limited to have a specific structure, processing steps or a material disclosed here, but can be extended to equivalent substitutions of these features understood by those skilled in the art. It can also be understood that terms here are only used to describe the objective of the specific embodiments, but are not intended to limit the present disclosure.

"An embodiment" or "embodiments" mentioned in the specification refers to that the specific features, structures or characteristics described in conjunction with the embodiment are included in at least one embodiment of the present disclosure. Therefore, a phrase "an embodiment" or "embodiments" everywhere in the specification does not necessarily refer to the same one embodiment.

Although the examples described above are used to illustrate a principle of the present disclosure in one or more applications, various modifications can be made to forms, usages or implementation details by those skilled in the art without creative work and without departing the principle and concept of the present disclosure. Therefore, the present disclosure is limited by the appended claims.

The invention claimed is:

1. A resistor switching circuit applied in a consumable chip, the resistor switching circuit comprising:
    a plurality of resistance switching branches, wherein each of the plurality of resistance switching branches comprises a switching switch and a resistor which are connected in series in a conductive loop of a signal line; and
    a decoder connected with a data storage module in the consumable chip and configured to generate a switching instruction based on a signal outputted by the data storage module, to control the switching switch of a respective one of the resistance switching branches to connect the resistor corresponding to the switching switch to the conductive loop of the signal line, so as to change a resistance value in the conductive loop of the signal line.

2. The resistor switching circuit according to claim 1, wherein the resistor switching circuit comprises four resistance switching branches, with resistance values of resistors in the four resistance switching branches being different from each other and increasing gradually from a first resistance switching branch to a fourth resistance switching branch.

3. The resistor switching circuit according to claim 2, wherein the decoder is a 2/4 decoder.

4. The resistor switching circuit according to claim 3, wherein the decoder is configured to:
    generate a switching instruction to connect the resistor in the first resistance switching branch to the conductive loop of the signal line, in a case that data received by the decoder is "00";
    generate a switching instruction to connect the resistor in a second resistance switching branch to the conductive loop of the signal line, in a case that data received by the decoder is "01";
    generate a switching instruction to connect the resistor in a third resistance switching branch to the conductive loop of the signal line, in a case that data received by the decoder is "10"; or
    generate a switching instruction to connect the resistor in the fourth resistance switching branch to the conductive loop of the signal line, in a case that data received by the decoder is "11".

5. The resistor switching circuit according to claim 1, wherein the switching switch comprises a transistor.

6. A storage circuit applied in a consumable chip, the storage circuit comprising:
    a data storage module;
    a read/write control circuit connected with the data storage module and configured to, based on an operation instruction and address data, write data into the data storage module or control the data storage module to output data; and a resistor switching circuit configured to change a resistance value in a conductive loop of a signal line based on the data outputted by the data storage module, wherein the resistor switching circuit comprises:

a plurality of resistance switching branches, wherein each of the plurality of resistance switching branches comprises a switching switch and a resistor which are connected in series in the conductive loop of the signal line; and a decoder connected with the data storage module in the consumable chip and configured to generate a switching instruction based on a signal outputted by the data storage module, to control the switching switch of a respective one of the resistance switching branches to connect the resistor corresponding to the switching switch to the conductive loop of the signal line, so as to change a resistance value in the conductive loop of the signal line.

7. The storage circuit according to claim 6, wherein the resistor switching circuit comprises four resistance switching branches, with resistance values of resistors in the four resistance switching branches being different from each other and increasing gradually from a first resistance switching branch to a fourth resistance switching branch.

8. The storage circuit according to claim 7, wherein the decoder is a 2/4 decoder.

9. The storage circuit according to claim 8, wherein the decoder is configured to:

generate a switching instruction to connect the resistor in the first resistance switching branch to the conductive loop of the signal line, in a case that data received by the decoder is "00";

generate a switching instruction to connect the resistor in a second resistance switching branch to the conductive loop of the signal line, in a case that data received by the decoder is "01";

generate a switching instruction to connect the resistor in a third resistance switching branch to the conductive loop of the signal line, in a case that data received by the decoder is "10"; or generate a switching instruction to connect the resistor in the fourth resistance switching branch to the conductive loop of the signal line, in a case that data received by the decoder is "11".

10. The storage circuit according to claim 6, wherein the switching switch comprises a transistor.

11. The storage circuit according to claim 6, wherein the storage circuit comprises a plurality of resistor switching circuits.

12. The storage circuit according to claim 6, wherein the data storage module comprises any one of an EERPOM memory, a ferroelectric memory, a phase change memory, a flash memory, and a volatile memory connected with a power supply.

13. A consumable chip comprising a storage circuit, wherein the storage circuit comprises:

a data storage module;

a read/write control circuit connected with the data storage module and configured to, based on an operation instruction and address data, write data into the data storage module or control the data storage module to output data; and a resistor switching circuit configured to change a resistance value in a conductive loop of a signal line based on the data outputted by the data storage module;

wherein the resistor switching circuit comprises:

a plurality of resistance switching branches, wherein each of the plurality of resistance switching branches comprises a switching switch and a resistor which are connected in series in the conductive loop of the signal line; and a decoder connected with the data storage module in the consumable chip and configured to generate a switching instruction based on a signal outputted by the data storage module, to control the switching switch of a respective one of the resistance switching branches to connect the resistor corresponding to the switching switch to the conductive loop of the signal line, so as to change a resistance value in the conductive loop of the signal line.

14. The consumable chip according to claim 13, wherein the resistor switching circuit comprises four resistance switching branches, with resistance values of resistors in the four resistance switching branches being different from each other and increasing gradually from a first resistance switching branch to a fourth resistance switching branch.

15. The consumable chip according to claim 14, wherein the decoder is a 2/4 decoder.

16. The consumable chip according to claim 15, wherein the decoder is configured to:

generate a switching instruction to connect the resistor in the first resistance switching branch to the conductive loop of the signal line, in a case that data received by the decoder is "00";

generate a switching instruction to connect the resistor in a second resistance switching branch to the conductive loop of the signal line, in a case that data received by the decoder is "01";

generate a switching instruction to connect the resistor in a third resistance switching branch to the conductive loop of the signal line, in a case that data received by the decoder is "10"; or generate a switching instruction to connect the resistor in the fourth resistance switching branch to the conductive loop of the signal line, in a case that data received by the decoder is "11".

17. The consumable chip according to claim 13, wherein the switching switch comprises a transistor.

18. The consumable chip according to claim 13, wherein the storage circuit comprises a plurality of resistor switching circuits.

19. The consumable chip according to claim 13, wherein the data storage module comprises any one of an EERPOM memory, a ferroelectric memory, a phase change memory, a flash memory, and a volatile memory connected with a power supply.

20. The consumable chip according to claim 13, further comprising:

an operation instruction generation circuit connected with the signal line and configured to generate an operation instruction based on a signal transmitted via the signal line and output the operation instruction to the read/write control circuit.

* * * * *